US012173428B2

(12) United States Patent
Johnson, II et al.

(10) Patent No.: US 12,173,428 B2
(45) Date of Patent: Dec. 24, 2024

(54) CONTROLLED SURFACE CHEMISTRY FOR POLYTYPIC AND MICROSTRUCTURAL SELECTIVE GROWTH ON HEXAGONAL SIC SUBSTRATES

(71) Applicant: Mainstream Engineering Corporation, Rockledge, FL (US)

(72) Inventors: Jesse A. Johnson, II, Melbourne, FL (US); Brian P. Tucker, Rockledge, FL (US); Adam J. Duzik, Rockledge, FL (US); Justin J. Hill, Cocoa, FL (US)

(73) Assignee: Mainstream Engineering Corporation, Rockledge, FL (US)

( * ) Notice: Subject to any disclaimer, the term of this patent is extended or adjusted under 35 U.S.C. 154(b) by 224 days.

(21) Appl. No.: 17/961,663

(22) Filed: Oct. 7, 2022

(65) Prior Publication Data
US 2024/0133077 A1 Apr. 25, 2024

(51) Int. Cl.
*C30B 33/12* (2006.01)
*C30B 29/26* (2006.01)
*C30B 29/66* (2006.01)

(52) U.S. Cl.
CPC ............. *C30B 29/66* (2013.01); *C30B 29/26* (2013.01); *C30B 33/12* (2013.01)

(58) Field of Classification Search
CPC ......... C30B 33/12; C30B 29/16; C30B 29/66; C30B 25/18
See application file for complete search history.

(56) References Cited

U.S. PATENT DOCUMENTS

| 5,363,800 | A | 11/1994 | Larkin et al. |
| 5,915,194 | A | 6/1999 | Powell et al. |
| 8,823,015 | B2 | 9/2014 | Momose et al. |
| 8,980,445 | B2 | 3/2015 | Leonard et al. |
| 2003/0070611 | A1* | 4/2003 | Nakamura ............ C30B 33/00 117/109 |
| 2004/0144301 | A1 | 7/2004 | Neudeck et al. |

(Continued)

*Primary Examiner* — Robert M Kunemund
(74) *Attorney, Agent, or Firm* — Michael W. O'Neill, Esq.

(57) ABSTRACT

A high-throughput method for identifying single crystal hexagonal-SiC off-axis surfaces that support surface chemistries and kinetics to selectively produce various epitaxial growth modes of the metastable 3C-SiC polytype is provided. In execution of the aforementioned method, the present invention also encompasses the use of a single crystal hexagonal-SiC domed substrate, and a method for manufacturing thereof. Said method for screening silicon carbide growth surfaces is comprised of: fabrication of a silicon carbide domed substrate; forming a step-terrace growth surface on the domed surface of said silicon carbide domed substrate by hydrogen etching; performing silicon carbide deposition upon said growth surface, thereby creating an silicon carbide epitaxial domed wafer; and characterization of said silicon carbide epitaxial domed wafer. Silicon carbide deposition upon a silicon carbide domed growth surface allows for the modulation of the supersaturation ratio under a single set of growth conditions. There is provided a method to select a specific off-cut angle and orientation for a silicon carbide substrate that can be used to selectively and homogeneously grow a targeted 3C-silicon carbide microstructure best suited for the intended application.

13 Claims, 13 Drawing Sheets

(56) References Cited

U.S. PATENT DOCUMENTS

| | | | |
|---|---|---|---|
| 2012/0248463 A1* | 10/2012 | Zhang | C30B 25/18 |
| | | | 117/88 |
| 2014/0070249 A1* | 3/2014 | Yoon | H01L 33/54 |
| | | | 257/98 |
| 2014/0220325 A1* | 8/2014 | Loboda | C30B 23/005 |
| | | | 428/215 |

* cited by examiner

CONTROLLED SURFACE CHEMISTRY FOR POLYTYPIC AND MICROSTRUCTURAL SELECTIVE GROWTH ON HEXAGONAL SIC SUBSTRATES

BACKGROUND

The present invention is a method for the determination of the role off-axis surfaces of hexagonal single crystal SiC substrates plays on modulating surface chemistry for polytypic and microstructural selectivity under epitaxial growth conditions. Particularly, the present invention is concerned with a high-throughput method for identifying single crystal hexagonal-SiC off-axis surfaces that support surface chemistries and kinetics to selectively produce various epitaxial growth modes of the metastable 3C-SiC polytype. In execution of the aforementioned method, the present invention also encompasses the use of a single crystal hexagonal-SiC domed substrate, and a method for manufacturing thereof.

Due to its isotropic properties, the cubic 3C polytype has emerged as a viable solution for several challenges presented in applications ranging from optics, power electronics, solid state quantum emitters, sensors, and device grade graphene or other 2D film growth materials. Currently, commercially available SiC substrates are not crystallographically oriented for the controlled growth of high quality 3C-SiC. In fact, most are engineered to suppress the nucleation of 3C-SiC.

In recent years, the accelerated demand to replace Si-based electronics for wide band-gap radio frequency (RF) and power electronics, sensors, and diodes has fueled research and development (R&D) efforts towards improving the crystalline quality and manufacturability of SiC-based devices. Unlike Si, where cubic meter scale volumes of single crystal can be grown from the melt via the Czochralski method, the underlying limitation for SiC production lies in the fact that congruent melting of SiC requires extreme pressures and temperatures that renders melt-growth techniques unfeasible for high-volume manufacturing. Consequently, production of electronic device grade single crystal SiC is predominantly achieved through seeded sublimation vapor phase growth by the modified Lely technique, which currently hinders SiC from reaching the production volumes of Si. Furthermore, SiC is a complex material system with over 250 polytypes that include cubic (C), hexagonal (H), and rhombohedral (R) crystal systems. Among the most technologically relevant polytypes are the hexagonal 4H and 6H phases, and the cubic 3C phase. Both 4H- and 6H-SiC are the most thermodynamically stable with a standard heat of formation, $\Delta H_f^o$ of −15.9 and −15.6 Kcal/mol, respectively. The 3C-SiC polytype is metastable with a $\Delta H_f^o$ of −15.0 Kcal/mol. Consequently, only 4H- and 6H-SiC bulk single crystals are currently able to be grown for the production of high quality SiC wafers. Thus, exploration of technologies utilizing 3C-SiC is further hindered by the lack of native substrates.

Large area, high-quality 3C-SiC epitaxy geared towards various technology applications is primarily achieved by heteroepitaxial growth on bulk 4H- and 6H-SiC substrates. Naturally, epitaxial growth of SiC on 4H- and 6H-substrates is a thermodynamic competition between duplicating the substrate via homoepitaxy and polytypic nucleation or heteroepitaxial growth. Due to the metastable nature of 3C-SiC, non-equilibrium conditions must be created to facilitate 3C-SiC nucleation. As such, there are a number of important parameters that play a significant role in polytypic selectivity.

From a structural aspect, an important relationship among the primary hexagonal polytypes and cubic 3C-SiC is that while both 4H- and 6H SiC have hexagonal unit cells, they both possess a mixture of cubic and hexagonal lattice positions. Interestingly, the majority of 6H-SiC is composed of cubic-type bonding and lattice sites with only 33% of the crystal lattice comprising of hexagonal atomic positions. 4H-SiC is composed of an equal number of hexagonal and cubic lattice positions. The {0001} basal planes of 4H- and 6H-SiC are the crystallographic equivalent of the 3C-SiC {111} planes, possessing identical atomic configurations and spacing. Depending on growth conditions, 3C-SiC can be observed to spontaneously nucleate on {0001} surfaces of 4H-and 6H-SiC substrates despite possessing higher formation energy.

From a kinetic aspect, several competing mechanisms with compelling evidence have been proposed; however, a consensus has yet to be agreed upon. Three prominent models for 3C nucleation include a compressive strain relieving mechanism, a step-bunching growth mechanism, and a defect modulated nucleation mechanism. Despite these seemingly competing models, a common element shared among each one involves the requirement of both Si-rich vapor phase chemistry and/or a critical adatom surface supersaturation. One theory that offers an explanation of the Si-rich vapor dependence beyond empirical observations is the compressive strain relieving mechanism. This theory suggest that an excess of carbon vacancies, $N^C_V$, introduced into growing hexagonal layers induces compressive stresses that are relieved by more energetically favorable cubic 3C-SiC formation after a critical $N^C_V$ is reached. Incorporation of excess carbon vacancies is practically achieved by tuning the [Si]/[C] ratio in the vapor phase to be Si rich in the growth zone. For sublimation based growth, the vapor species produced from SiC source material is composed of Si, $Si_2C$, and $SiC_2$. Additionally, carbon vapor is produced from graphite crucibles used to hold SiC source material. Tuning of the vapor phase chemistry can be achieved by lining graphite crucibles with W plates, or with Hf, Ta, or Zr foils that act as C getters. Furthermore, the polytypic transition from hexagonal to cubic 3C-SiC is not observed to be discrete with an abrupt transition to the cubic phase under Si rich deposition conditions, but is precluded by a homoepitaxial transition layer. This aspect is also shared with the explanation provided by the step-bunching growth mechanism, albeit the transition layer phenomenon is ascribed to effects of adatom surface supersaturation.

The role of adatom surface supersaturation and its modulation has been observed to be the dominating factor towards nucleation of the 3C-SiC polytype. For hexagonal-SiC and III-V semiconductors, high quality homoepitaxial growth is achieved under the step-flow growth mode rather than layer-by-layer growth observed for cubic-Si and cubic-Ge. Step-flow growth is explained by the terrace-kink model and is discussed accordingly. With substrates possessing hexagonal crystal structures, nominal basal plane {0001} oriented substrates rarely consist of atomically flat surfaces, but exhibit discontinuities in the form of atomically flat {0001} terraces of length $\lambda_0$, and atomic level steps of height, h. Additionally, discontinuities in the steps, or terrace edges, are known as kink sites. Due to the number of broken bonds at each respective site, surface energy increases in the order of terrace surface, to terrace edge, and kink sites. A fundamental requirement for crystal growth to occur is for a condition of supersaturation to be satisfied on the growth surface. This condition is fulfilled when the supersaturation ratio of adatoms ($\alpha = n_s/n_{so}$) is greater than unity, where $n_s$ and $n_{s0}$ are the adatom concentration and equilibrium adatom concentration, respectively. The condition for the terrace-kink growth model is met when the flux of incoming adsorbed adatoms equals the diffusion flux towards terrace edges, and is expressed by the continuity equation:

$$-D_s \frac{d^2 n_s(y)}{dy^2} = J - \frac{n_s(y)}{\tau_s}, \quad (1)$$

where y is the terrace position normal to an edge, $D_s$ is the surface diffusion coefficient, J is the flux of adatoms arriving at the surface, and $\tau_s$ is the mean desorption time. In terms of surface energy, this condition allows for adatoms to migrate from terrace surfaces, to the edges, and finally to kink sites, thereby lowering the overall surface energy. The step-flow growth mode is then characterized by the replication of the substrate at the terrace edges as they grow by sweeping across the surface at a certain velocity. Under the assumption that terrace edges act as perfect sinks for adsorbed adatoms, applying the continuity equation using the boundary condition that the supersaturation ratio equals unity ($n_s = n_{s0}$) at the terrace edges ($y = \pm \lambda_0/2$), the maximum supersaturation ratio is found to exist at the midpoint between terrace edges and is expressed by $$\alpha_{max} = 1 + \frac{\lambda_0 n_0 R}{2\lambda_s h} \frac{\tau_s}{n_{s0}} \tanh\left(\frac{\lambda_0}{4\lambda_s}\right) \quad (2)$$

where $n_0$ is the concentration of adatom sites, R is the step-flow growth rate, and $\lambda_s$ is the adatom "step-free" surface migration length. The $\alpha_{max}$ strictly depends on growth conditions such as the growth rate, growth temperature, and terrace width. Equally as important, the terrace-kink model and step-flow growth mode is upheld so long as the $\alpha_{max}$ remains below a critical supersaturation ratio, $\alpha_{crit}$. Concurrent with the breakdown of the terrace-kink model, exceeding $\alpha_{crit}$ initiates 2-D nucleation upon the terrace surface rather than exclusively at terrace edges. Under classical nucleation theory, following the assumption that the critical nucleation rate, $J^*_{nuc}$, is $10^{12}$ cm$^{-2}$s$^{-1}$ for a disk-shaped nucleus (corresponding to one nucleation per unit time on a 10×10 nm$^2$ area), $\alpha_{crit}$ is expressed by $$\alpha_{crit} = \exp\left(\frac{\pi h \sigma^2 \Omega}{(65 - \ln 10^{12})K^2 T^2}\right) \quad (3)$$

where $\Omega$ is the volume of a Si—C pair, and $\sigma$ is the surface free energy. Fundamentally, for a fixed growth temperature $\alpha_{crit}$ is primarily dependent on the surface free energy and is an intrinsic property of the growth surface material. For {0001} oriented hexagonal-SiC surfaces, the combination of the crystallographic atomic configuration and satisfying the condition for 2-D nucleation on terrace surfaces implicates the nucleation of 3C-SiC due to the lack of stacking information provided by the terrace edges. As $\alpha_{crit}$ is intrinsic to the material for a fixed growth temperature, a primary tuning parameter for determining whether $\alpha_{max}$ reaches $\alpha_{crit}$ is modulating the nominal {0001} terrace width of hexagonal substrates. This is achieved by mechanically preparing off-axis surfaces by cutting substrates at an off-angle relative to the <0001> direction. The larger the off-cut angle, the higher the step density, and the shorter the {0001} terraces become.

Concerning the selective polytypic growth of 3C-SiC on hexagonal-SiC substrates, it is reiterated that the quantitative understanding of the terrace-kink model described above only explains coherent epitaxial step-flow growth, and that this model and understanding breaks down once $\alpha_{crit}$ is reached and 2D-nucleation is initiated. Hence, the lack of consensus on the mechanism for satisfying the conditions for 3C-SiC nucleation and subsequent growth, despite sharing the fundamental requirement of reaching $\alpha_{crit}$. The compressive strain relieving mechanism suggest that as Si-rich deposition progresses on off-axis substrates, a compressively strained homoepitaxial transition layer eventually develops an extended {0001} terrace upon which 3C-SiC nucleation occurs, forming a seed for subsequent lateral growth. The step-bunching growth mechanism suggest that non-uniform step velocity during step-flow growth eventually leads to faster growing steps to coalesce with slower growing steps forming larger {0001} terraces that allows for 3C nucleation to occur. The defect modulated nucleation mechanism suggest that substrate defects and imperfections lead to the generation of stacking faults in homoepitaxial layers that grow into expanding {0001} surfaces allowing 3C nucleation to occur. Furthermore, the multitude of various growth conditions used among these studies, including off-cut angle, contributes to preventing a cohesive understanding towards selective polytypic epitaxy. Additionally, the terrace-kink model only considers growth upon surfaces with uniform terrace edges (i.e., straight edges), therefore the relationship between $\alpha_{max}$ and $\alpha_{crit}$ that dictates 3C-SiC nucleation is limited to substrates with off-cuts oriented towards the low index ⟨1$\bar{1}$00⟩ and ⟨11$\bar{2}$0⟩ directions. Overall, the understanding of 3C-nucleation and growth, and by extension the control thereof, is limited to empirical observations.

Apart from establishing an understanding on the selective nucleation of 3C-SiC on hexagonal-SiC substrates, is the need to also control the microstructure of the epitaxial layer. Both textured polycrystalline epitaxial layers as well as single crystal 3C-SiC are important for various technological applications. For example, <111> oriented polycrystalline films are ideal for producing high-quality large area graphene monolayers, <110> oriented films are ideal for the fabrication of pressure sensors and also act as favorable substrates that support biological sensor fabrication, and single crystal 3C-SiC is needed for optical and high power/high frequency electrical device fabrication.

Due to the orientation specific technological utility of various hexagonal semiconductors, the ability to efficiently map orientation dependent anisotropic properties is likewise of high technological importance. Accordingly, there have been a few examples of mapping techniques utilizing structures with 360° of azimuthal oriented features to observe anisotropic properties. For example, anisotropic etching chemistries were studied using a circular 360° array of high aspect ratio narrow angle (1-2°) wedges consisting of surfaces perpendicular to the {0001} normal of Al$_{1-x}$Ga$_x$N by Kazanowska et al, "Exploring AlGaN nanostructures fabricated via chemical wet etching", Proc. SPIE 11686, Gallium Nitride Materials and Devices XVI, 1168625 (6 Mar. 2021); https://doi.org/10.1117/12.2582551. For crystal growth, domed substrates have been used to examine crystal quality of epitaxial cubic CdTe grown on CdTe and GaAs surfaces encompassing a continuous range of off-cut angles across 360° of azimuthal orientation. These studies were found in the works of Snyder et al, "Effect of substrate misorientation on surface morphology of homoepitaxial CdTe films grown by organometallic vapor phase epitaxy." Applied physics letters 58, no. 8 (1991): 848-850, and by Hamilton et al, "The effect of substrate tilt on MOCVD growth of {100} CdTe on {100} GaAs." Journal of electronic materials 22, no. 8 (1993): 879-885. However, there are fundamental differences of the CdTe system where observations do not translate to SiC. The first is that there are no polytypes of CdTe other than the cubic phase that are readily produced during epitaxial growth, and both CdTe substrates and epitaxial films have the same cubic crystal structure. The second is that CdTe exhibits mixed bonding with partially covalent and ionic characteristics, whereas all polytypes of SiC only possess purely non-polar sp a hybridized covalent bonding. Consequently, the surface chemistry and kinetics of SiC growth lead to observations not obvious with respect to those of CdTe.

The following prior art have presented hexagonal-SiC substrates for the purpose of selective 3C-SiC epitaxy: U.S. Pat. Nos. 5,363,800; 5,915,194; and U.S. Pat. Pub. 2004/0144301.

As previously discussed, a recurring theme surrounding 3C-SiC epitaxy on hexagonal-SiC substrates is facilitating the controlled nucleation and subsequent growth of the cubic polytype. An additional caveat of 3C-SiC growth relevant for technological application is controlling the crystal quality and managing defect formation. 3C growth is prone to the formation of defects known as double position boundaries (DPBs) on {0001}-based hexagonal SiC substrates. Due to the crystallographic equivalence of the hexagonal-{0001} and cubic {111} planes along with the rotational symmetry of the cubic phase, the 3C polytype can nucleate domains with either an ABC or an ACB stacking sequence that simply differ by a 60° rotation about the <111> axis. The coalescence of two domains with these opposing stacking sequences forms incoherent interfaces that define DPBs, and generally are formed at high densities resulting from the product of random nucleation events. Information relevant to attempts to address these problems can be found in U.S. Pat. Nos. 5,363,800 and 5,915,194, and U.S. Pat. Pub. 2004/0144301. However, each one of these references suffers from one or more of the following disadvantages: 1) the wafers are only engineered to produce single crystal 3C-SiC, 2) only one off-cut degree and orientation can be examined at a time making the substrate-tilt screening process costly and time consuming, 3) selective 3C-SiC growth methods rely on atomically precise preparation of multiple engineered growth sites on a single substrate that is ultimately not conducive to large-scale manufacturing, 4) only 6H-SiC is considered for growth of 3C-SiC epitaxial layers, 5) growth methods are only capable of producing limited volumes of 3C-SiC.

For the foregoing reasons, there is a need for methods that are more efficient for exploring off-cut angles oriented in crystallographic directions that are conducive to selectively growing large area cubic 3C-SiC of controlled microstructures depending on the needs of the intended application.

SUMMARY

The present invention has been made in light of the shortcomings described above. The first object of the present invention is to provide a method for high-throughput determination of the role off-axis surfaces of hexagonal single crystal SiC substrates plays on modulating surface chemistry for polytypic and microstructural selectivity, thereon under growth conditions that thermodynamically encourages the epitaxial growth of targeted polytypes.

The second object of the present invention is to provide a high quality mechanically prepared domed-substrate composed of single crystal hexagonal silicon carbide that serves as the medium for determining the role off-cut degree and orientation plays on altering surface chemistry for polytypic and microstructural selectivity, thereon under growth conditions that thermodynamically encourages the epitaxial growth of targeted polytypes.

The third object of the present invention is to provide a method for manufacturing hexagonal single crystal SiC domed substrates described above.

The inventors further declare this not to be exclusive to SiC but a variety of vapor or liquid phase epitaxy methods for numerous semiconductor materials.

An aspect of the disclosure is for determining off-cut orientations of a single crystal hexagonal SiC substrate that supports the surface chemistry to selectively produce the metastable 3C-SiC polytype of various microstructures under epitaxial growth conditions. An aspect of the disclosure is a mechanically prepared, single crystal, hexagonal-SiC domed-substrate defined by a low-index direction as the polar axis. The low-index directions used as the polar axis may include the $\langle 0001 \rangle$, $\langle 1\bar{1}00 \rangle$, and $\langle 11\bar{2}0 \rangle$ directions. The domed surface of the substrate is defined with a polar angle ranging from 0-15°, and an azimuthal angle ranging from 0-360° for the selective growth and controlled microstructure of metastable cubic 3C-SiC. Another aspect of the disclosure is a method for manufacturing single crystal, hexagonal-SiC domed-substrates from bulk, hexagonal-SiC single crystal boules.

Another aspect of the disclosure is for high-throughput screening of silicon carbide surfaces that support surface chemistries and kinetics of selective polytypic and microstructural growth modes during silicon carbide deposition, by processing a silicon carbide domed substrate; forming a step-terrace growth surface on the domed surface of said silicon carbide domed substrate by hydrogen etching; performing silicon carbide deposition upon said growth surface, thereby creating an silicon carbide epitaxial domed wafer; and performing characterization of said silicon carbide epitaxial domed wafer.

Another aspect of the disclosure is the silicon carbide domed substrate is a silicon carbide single crystal with a polytype selected from the group consisting of the 3C, 4H, 6H, 2H, and 15R polytypes.

Another aspect of the disclosure is the silicon carbide domed substrate contains an atomically smooth domed surface with either a $\langle 0001 \rangle$, $\langle 11\bar{2}0 \rangle$, or $\langle 1\bar{1}00 \rangle$ polar axis.

Another aspect of the disclosure is the silicon carbide domed substrate has a diameter within the range of 20 mm to 200 mm.

Another aspect of the disclosure is the silicon carbide domed substrate contains an atomically smooth domed surface defined by a continuous variation of an off-cut angle from a polar axis ranging from 0 degrees to some maximum off-cut angle, and 360 azimuth degrees.

Another aspect of the disclosure is that the silicon carbide domed substrate according to other aspects of the disclosure is the maximum off-cut angle is within the range of 4 degrees to 20 degrees.

Another aspect of the disclosure is the fabrication of a silicon carbide domed substrate is further characterized by the core drilling an on-axis bulk single crystal silicon carbide boule producing a single crystal silicon carbide cylinder such that the top and bottom surface of said silicon carbide cylinder is an on-axis surface; forming a flat silicon carbide substrate from dicing said silicon carbide cylinder with cuts oriented parallel to the on-axis surface such that the top and bottom surface of said silicon carbide substrate is an on-axis surface; and forming a domed silicon carbide substrate from said flat silicon carbide substrate by grinding, polishing, and chemical mechanical polishing such that the domed silicon carbide substrate has an on-axis surface and an atomically smooth domed surface with a ⟨0001⟩ polar axis.

Another aspect of the disclosure is the fabrication of a silicon carbide domed substrate is further characterized by forming a flat silicon carbide substrate from dicing an on-axis bulk single crystal silicon carbide boule with cuts oriented parallel to the on-axis surface such that the top and bottom surface of said silicon carbide substrate is an on-axis surface; and forming a domed silicon carbide substrate from said flat silicon carbide substrate by grinding, polishing, and chemical mechanical polishing such that the domed silicon carbide substrate has an on-axis surface and an atomically smooth domed surface with a ⟨0001⟩ polar axis.

Another aspect of the disclosure is the fabrication of a silicon carbide domed substrate is further characterized by dicing an on-axis bulk single crystal silicon carbide boule producing a silicon carbide parallelpiped such that the surfaces are comprised of {0001}, {11$\bar{2}$0}, and {1$\bar{1}$00} surfaces; core drilling said silicon carbide parallelpiped producing a single crystal silicon carbide cylinder such that the top and bottom flat surfaces are either an {0001}, {11$\bar{2}$0}, or {1$\bar{1}$00} on-axis surface; forming a flat silicon carbide substrate from said silicon carbide cylinder by dicing with cuts oriented parallel to the on-axis surface such that the top and bottom surface of said silicon carbide substrate are either an {0001}, {11$\bar{2}$0}, or {1$\bar{1}$00} on-axis surface; and forming a domed silicon carbide substrate from said flat silicon carbide substrate by grinding, polishing, and chemical mechanical polishing such that the domed silicon carbide substrate has an on-axis surface and an atomically smooth domed surface with a ⟨0001⟩, ⟨11$\bar{2}$0⟩, or ⟨1$\bar{1}$00⟩ polar axis.

Another aspect of the disclosure is the fabrication of a silicon carbide domed substrate is further characterized by dicing an {0001} off-axis bulk single crystal silicon carbide boule with cuts parallel to the {0001} plane forming an on-axis bulk single crystal silicon carbide boule; and forming a flat silicon carbide substrate from dicing said on-axis bulk single crystal silicon carbide boule with cuts oriented parallel to the on-axis surface such that the top and bottom surface of said silicon carbide substrate is an on-axis surface; and forming a domed silicon carbide substrate from said flat silicon carbide substrate by grinding, polishing, and chemical mechanical polishing such that the domed silicon carbide substrate has an on-axis surface and an atomically smooth domed surface with a ⟨0001⟩ polar axis.

Another aspect of the disclosure is the fabrication of a silicon carbide domed substrate is further characterized by dicing an {0001} off-axis bulk single crystal silicon carbide boule producing a {0001} off-axis silicon carbide parallelpiped such that one pair of identical surfaces are comprised of a {0001} off-axis surface, and at least one other pair of identical surfaces are comprised of either a {1$\bar{1}$00} or {11$\bar{2}$0} surface; forming an {0001} on-axis silicon carbide parallelpiped from cutting said off-axis silicon carbide parallelpiped such that one pair of identical surfaces are comprised of a {0001} on-axis surface, and at least one other pair of identical surfaces are comprised of either a {1$\bar{1}$00} or {11$\bar{2}$0} surface; forming a flat silicon carbide substrate from dicing said on-axis silicon carbide parallelpiped with cuts oriented parallel to either a {0001}, {11$\bar{2}$0}, or {1$\bar{1}$00} on-axis surface such that at least two pairs of identical surfaces contain a combination of {0001}, {11$\bar{2}$0}, or {1$\bar{1}$00} surfaces; forming a circular silicon carbide substrate from core drilling said flat silicon carbide substrate such that the top and bottom flat surface is either a {0001}, {11$\bar{2}$0}, or {1$\bar{1}$00} on-axis surface; and forming a domed silicon carbide substrate from said circular silicon carbide substrate by grinding, polishing, and chemical mechanical polishing such that the domed silicon carbide substrate has an {0001}, {11$\bar{2}$0}, or {1$\bar{1}$00} on-axis surface and an atomically smooth domed surface with a ⟨0001⟩, ⟨11$\bar{2}$0⟩, or ⟨1$\bar{1}$00⟩ polar axis.

Another aspect of the disclosure is the manufacturing the silicon carbide epitaxial domed wafer disclosed in other aspects of the disclosure is further characterized by one of chemical vapor deposition (CVD), physical vapor transport (PVT), continuous feed-PVT, physical vapor deposition (PVD), liquid phase epitaxy (LPE), or vapor-liquid-solid methods is used for forming the epitaxial film on the step-terrace growth surface of the domed silicon carbide substrate.

Another aspect of the disclosure is further characterizing the silicon carbide epitaxial domed wafer disclosed in other aspects as being performed by characterization in either a plan-view or cross sectional configuration with one or more methods including optical microscopy, differential interference contrast microscopy, atomic force microscopy, scanning electron microscopy, scanning/transmission electron microscopy, X-ray photoelectron spectroscopy, Raman spectroscopy, UV-Vis spectroscopy, ellipsometry, (micro) X-ray diffraction, Synchrotron X-ray analysis, electron diffraction, and neutron scattering.

The present invention improves on the known variations of determining the ideal off-axis orientation for single crystal, hexagonal SiC substrates to selectively produce a desired SiC polytype and microstructure under epitaxial growth conditions by providing a growth surface that encompasses a wide range of off-cut orientations on a single substrate. With these features and subsequent to epitaxial growth under various conditions, a wafer with a surface comprising of a specific off-cut angle and directional orientation can be selected as an optimal substrate for the high quality and homogenous growth of a desired SiC polytype and microstructure best suited for the intended application.

BRIEF DESCRIPTION OF THE DRAWINGS

These and other features, aspects, and advantages of the present invention will become better understood with regard to the following description, appended claims, and accompanying drawings where:

DESCRIPTION

In the Summary above and the Description, and the claims below, and in the accompany drawings, reference is made to particular features (including method steps) of the invention. It is to be understood that the disclosure of the invention in this specification includes all possible combinations of such particular features. For example, where a particular aspect or embodiment of the invention, or a particular claim, that feature can also be used, to the extent possible, in combination with and/or in the context of the other particular aspects and embodiments of the invention, and in the invention generally.

Figure 1:
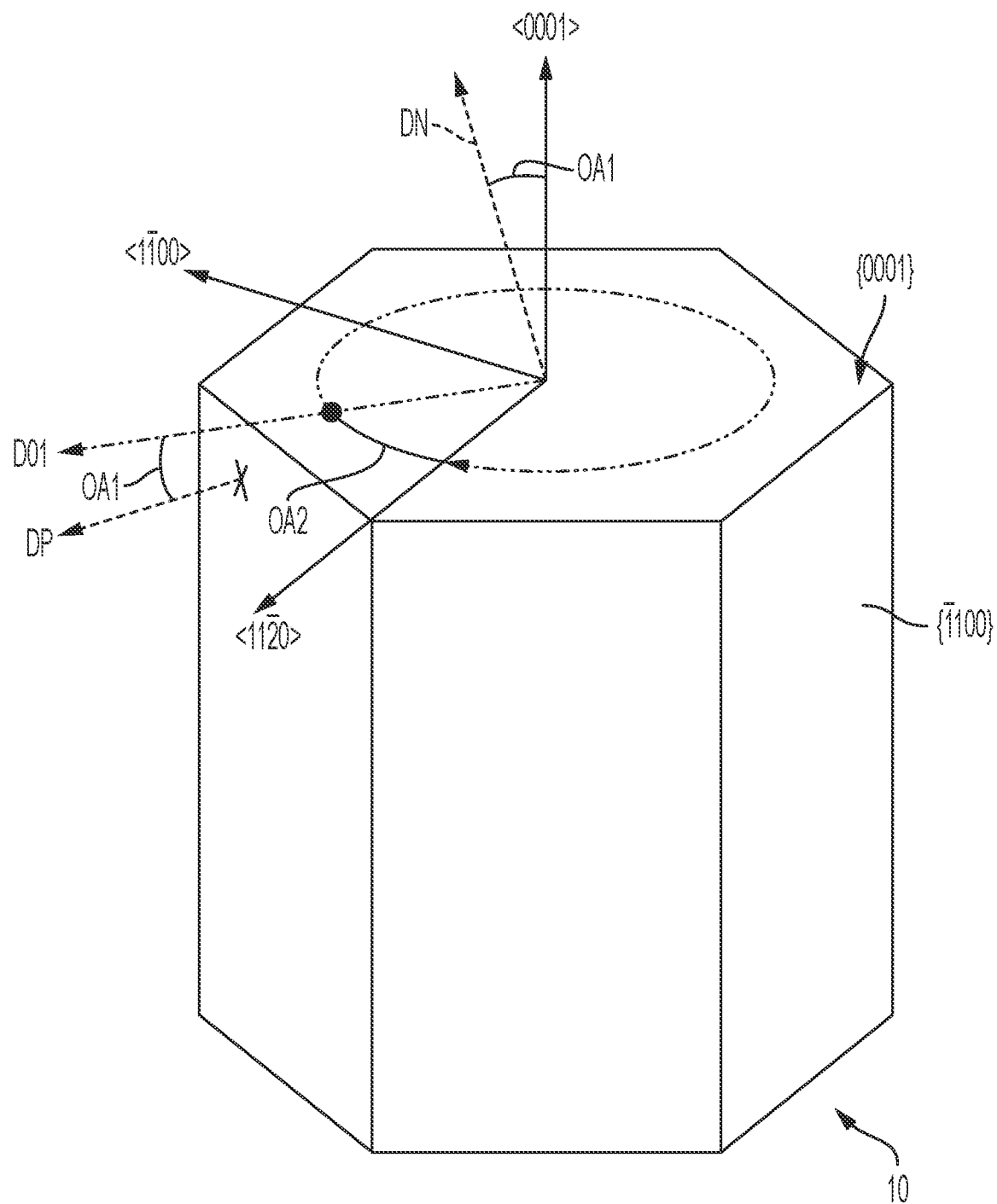
FIG. 1 shows a schematic perspective view of the crystal structure for hexagonal silicon carbide including the coordinates for off-angle orientations.

It is noted that for reasons of continuity and clarity, the same or corresponding parts are labeled with the same reference numerals in the following drawings, and descriptions thereof may not be repeated. Now referring to FIG. 1, a schematic of a hexagonal prism 10 approximating the 4H- and 6H-silicon carbide unit cell and crystal structure applicable to silicon carbide single crystals is shown. The <0001> axis is along the axial direction of hexagonal prism 10 comprised of a {0001} plane orthogonally surrounded by six equivalent {$\bar{1}$100} planes. The [0001] direction on the <0001> axis is normal to the (0001) plane that is the Si surface of the hexagonal-silicon carbide crystal structure, and the [000$\bar{1}$] direction on the <0001> axis is normal to the (000$\bar{1}$) plane that is the C surface. The six vertices of hexagonal prism 10 lie in the direction of the six equivalent $\langle$11$\bar{2}$0$\rangle$ directions and the sides of hexagonal prism 10 defined by the six equivalent {$\bar{1}$100} planes are normal to the six equivalent $\langle$1$\bar{1}$00$\rangle$ directions. The $\langle$11$\bar{2}$0$\rangle$ directions and the $\langle$1$\bar{1}$00$\rangle$ directions are all orthogonal to the <0001> axis. Furthermore, the equivalent $\langle$11$\bar{2}$0$\rangle$ directions are separated by 60-degree increments, and the equivalent $\langle$1$\bar{1}$00$\rangle$ directions are separated by 60-degree increments, where adjacent $\langle$1$\bar{1}$00$\rangle$ and $\langle$11$\bar{2}$0$\rangle$ directions are separated by 30-degree increments.

Additionally, the growth surfaces of engineered single crystal silicon carbide wafers may be tilted at an off-cut angle OA1 relative to a {0001} plane of the hexagonal-silicon carbide unit cell such that the direction normal DN to the growth surface is tilted by off-cut angle OA1 relative to a $\langle$0001$\rangle$ direction. The directional orientation of the tilt is defined in the direction D01 that may be equivalent to any direction within the {0001} plane. On hexagonal prism 10, direction D01 is defined by an off-angle OA2 relative to a $\langle$11$\bar{2}$0$\rangle$ direction. The resulting orientation of the tilt for an engineered growth surface is such that a direction parallel DP to the surface is orthogonal to direction normal DN, and defined by OA1 and OA2 from directions D01 and $\langle$11$\bar{2}$0$\rangle$ respectively. In other embodiments, off-angle OA1 and off-angle OA2 may be oriented in reference to either the $\langle$0001$\rangle$, $\langle$11$\bar{2}$0$\rangle$, or $\langle$1$\bar{1}$00$\rangle$ directions. Likewise, the direction D01 may lie on either the {0001}, {11$\bar{2}$0}, or {1$\bar{1}$00} planes. The inventors can deduce similar novel-oriented wafer products can be obtained for purpose-driven epitaxial growth to achieve desirable epitaxial properties not previously disclosed.

Figure 2:
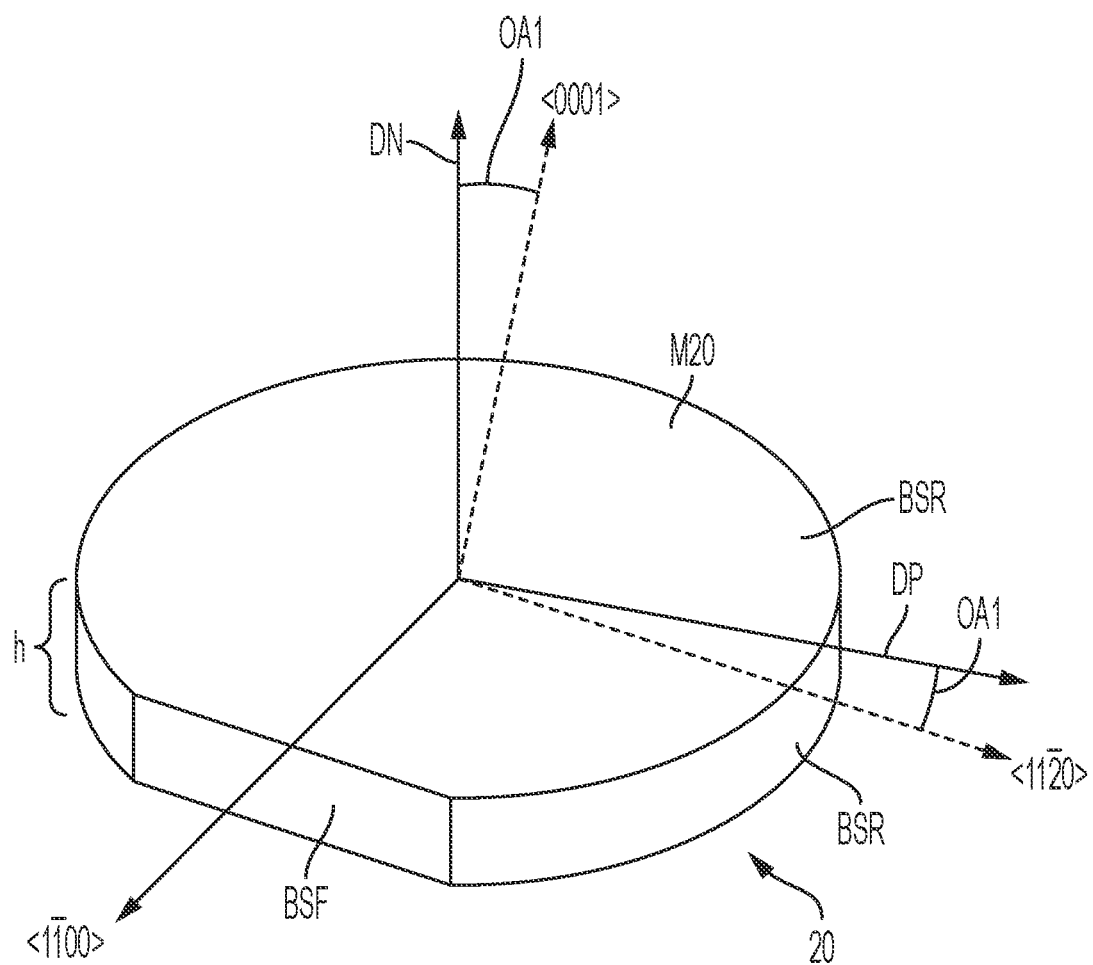
FIG. 2 shows a schematic perspective view of a silicon carbide single crystal boule.

A method of manufacturing a domed single crystal silicon carbide substrate will now be described with reference to FIGS. 2 to 8. FIG. 2 shows a bulk silicon carbide boule 20 used as the starting material for the fabrication of the domed silicon carbide substrate. Silicon carbide boule 20 is a single crystal silicon carbide boule with height h, and main surface M20 surrounded by round surface BSR and flat surface BSF. The diameter of silicon carbide boule 20 is 50 to 200 mm. Most commercially available silicon carbide boules are either on-axis, or possess an off-cut OA1 towards the $\langle$11$\bar{2}$0$\rangle$ or $\langle$1$\bar{1}$00$\rangle$ directions. In silicon carbide boule 20, main surface M20 is defined by direction normal DN and direction parallel DP such that the off-cut angle OA1 ranges from 0 degrees for on-axis, up to 12 degrees from the <0001> direction. Off-cut OA1 is oriented towards the $\langle$11$\bar{2}$0$\rangle$ direction and flat surface BSF is oriented parallel to a {1$\bar{1}$00} plane as a reference such that the $\langle$1$\bar{1}$00$\rangle$ direction is normal to surface BSF and orthogonal to both normal direction DN and parallel direction DP. Other embodiments of the present invention may possess a reference flat surface BSF that is parallel to either a {0001} or {11$\bar{2}$0} plane. Additionally, silicon carbide boule 20 may also contain a secondary reference flat surface of shorter length than flat surface BSF and oriented orthogonal to flat surface BSF.

Figure 3:
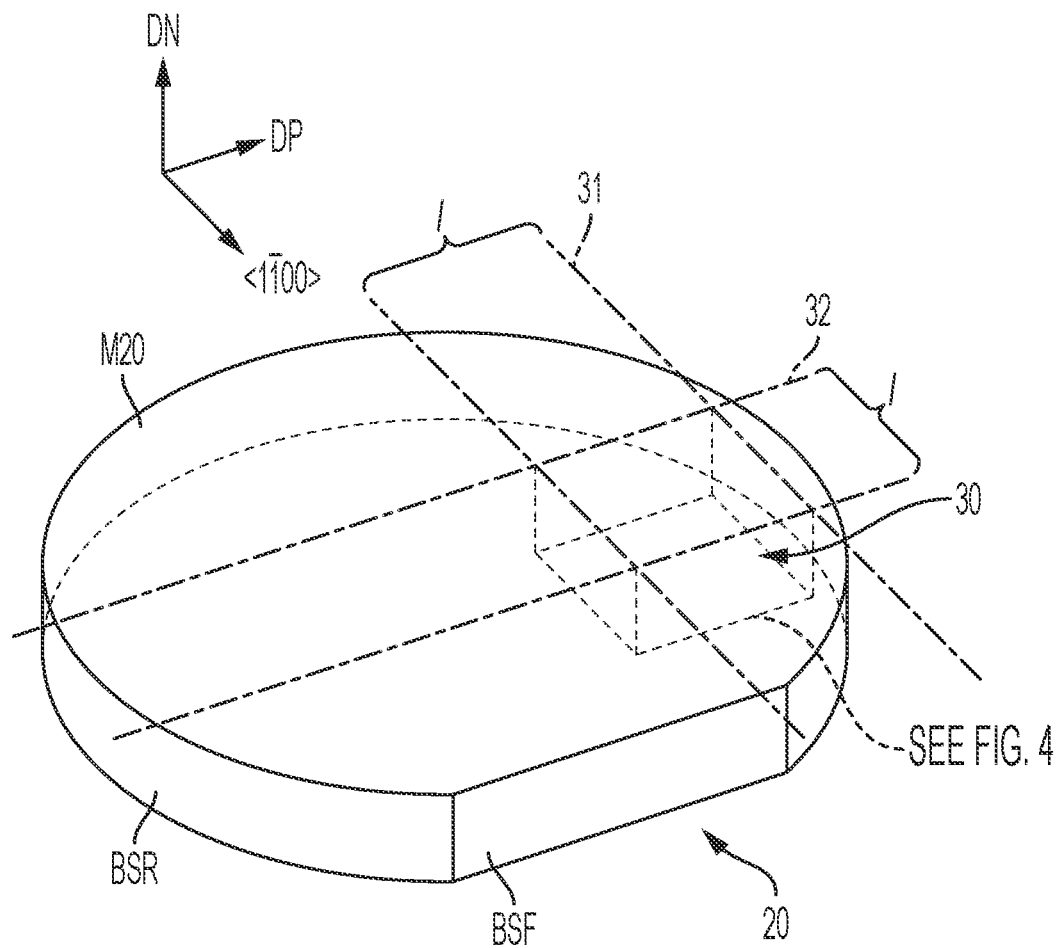
FIG. 3 shows a schematic perspective view of a dicing sequence step of a silicon carbide single crystal boule.

FIG. 3 shows the primary dicing sequence step of silicon carbide boule 20. The dicing sequence consists of orthogonal cuts 31 and parallel cuts 32 relative to flat surface BSF. Both orthogonal cuts 31 and parallel cuts 32 are equally spaced by length $\ell$, producing single crystal silicon carbide parallelpiped 30 with dimensions of $\ell \times \ell \times h$. The spacing $\ell$ of the cuts may range from 20 mm to 70 mm.

Figure 4:
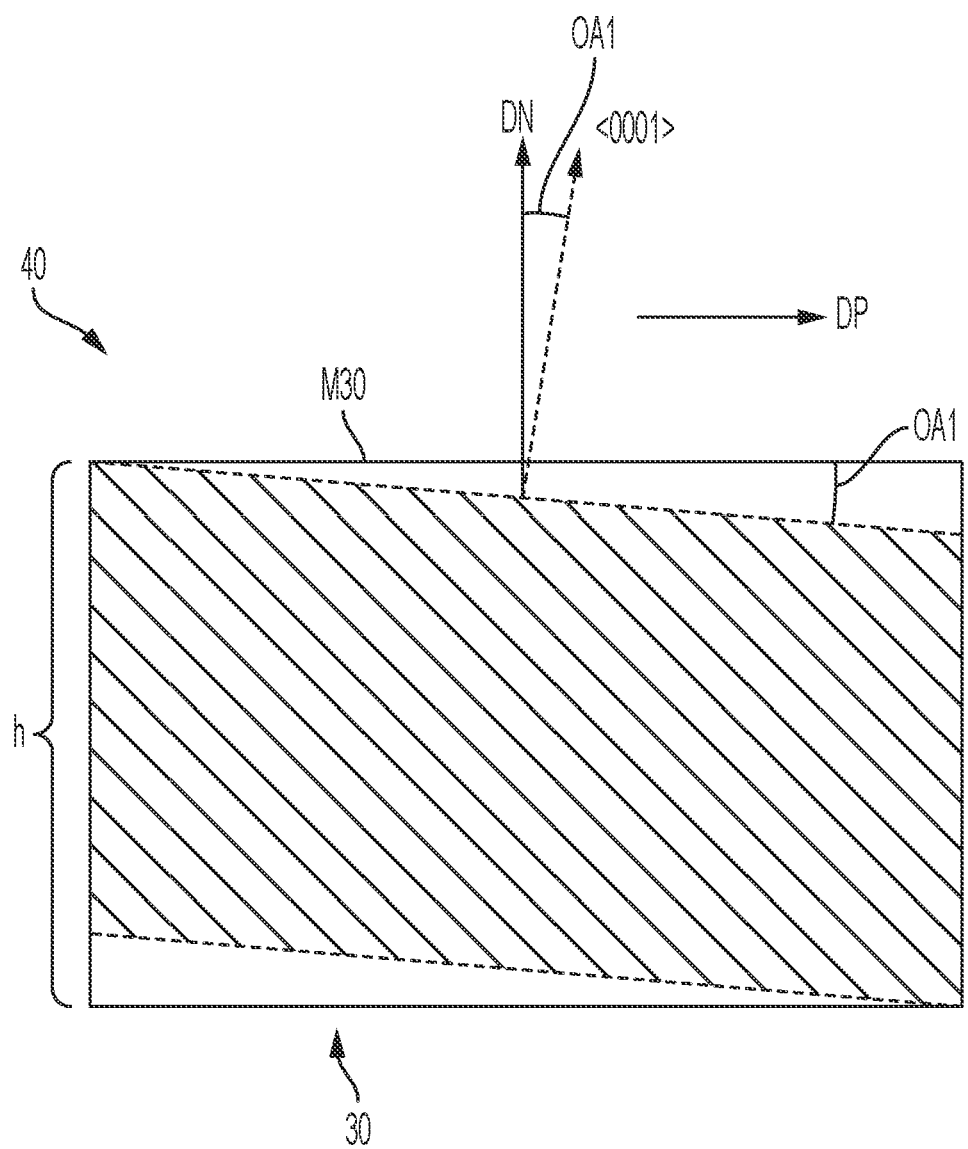
FIG. 4 shows a schematic side view of the orientation correcting dicing sequence step of a block cut from a single crystal silicon carbide boule.

FIG. 4 shows the orientation correcting dicing sequence step of single crystal silicon carbide parallelpiped 30 with main surface M30 identically oriented to main surface M20 of silicon carbide boule 20. For on-axis silicon carbide boules, off-cut angle OA1 equals zero degrees where direction normal DN is equivalent to the <0001> or low index directions $\langle$11$\bar{2}$0$\rangle$ and $\langle$1$\bar{1}$00$\rangle$, and no orientation correcting dicing sequence is needed. For silicon carbide boules with a non-zero off-angle OA1, single crystal silicon carbide parallelpiped 30 is cut at an off-cut angle OA1 oriented towards the parallel direction DP to produce single crystal silicon carbide parallelpiped 40 with an on-axis surface.

Figure 5:
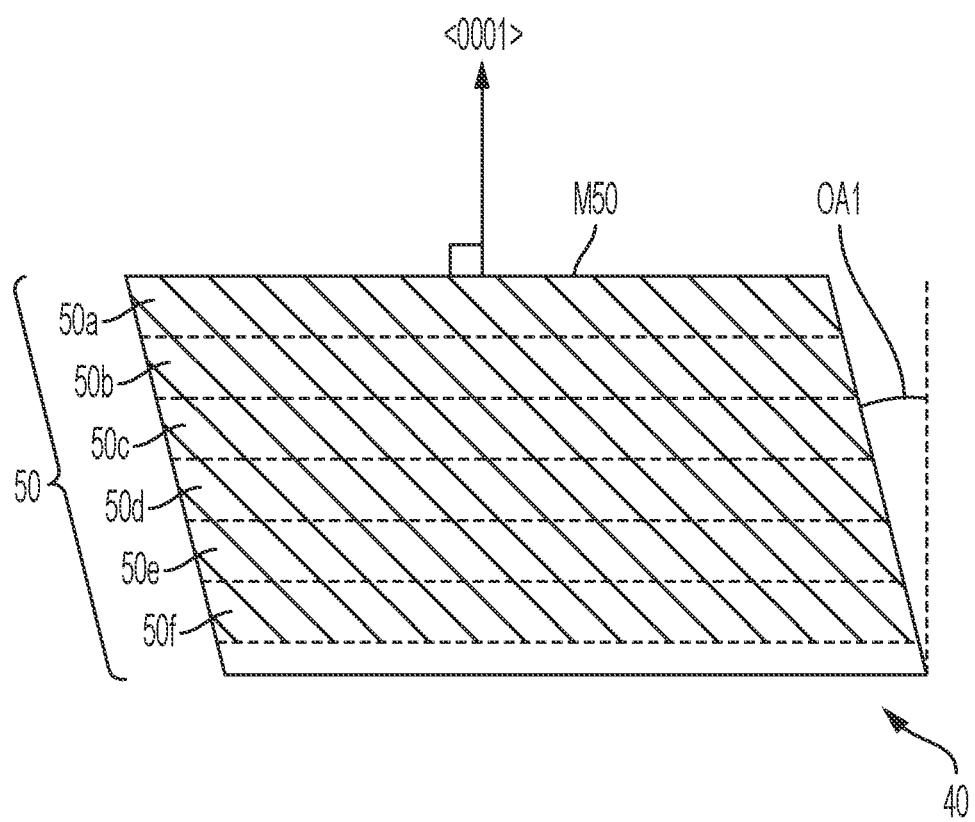
FIG. 5 shows a schematic side view of the wafer cutting dicing sequence step of an orientation corrected single crystal silicon carbide block.

FIG. 5 shows the wafer dicing sequence step of single crystal silicon carbide parallelpiped 40 with main surface M50 that is oriented with direction normal DN equivalent to the <0001> or low index directions $\langle$11$\bar{2}$0$\rangle$ and $\langle$1$\bar{1}$00$\rangle$. A set of parallelpiped single crystal hexagonal-silicon carbide substrates 50a-50f (also collectively referred to as 50) each having a main surface M50 are candidates for fabricating single crystal silicon carbide domed substrates. Each silicon carbide substrate 50 is in the shape of a parallelpiped with main surface M50 surrounded by four flat parallelogram shaped sides. Main surface M50 is an on-axis surface, consisting of either a {0001}, {11$\bar{2}$0}, or {1$\bar{1}$00} plane.

Figure 6:
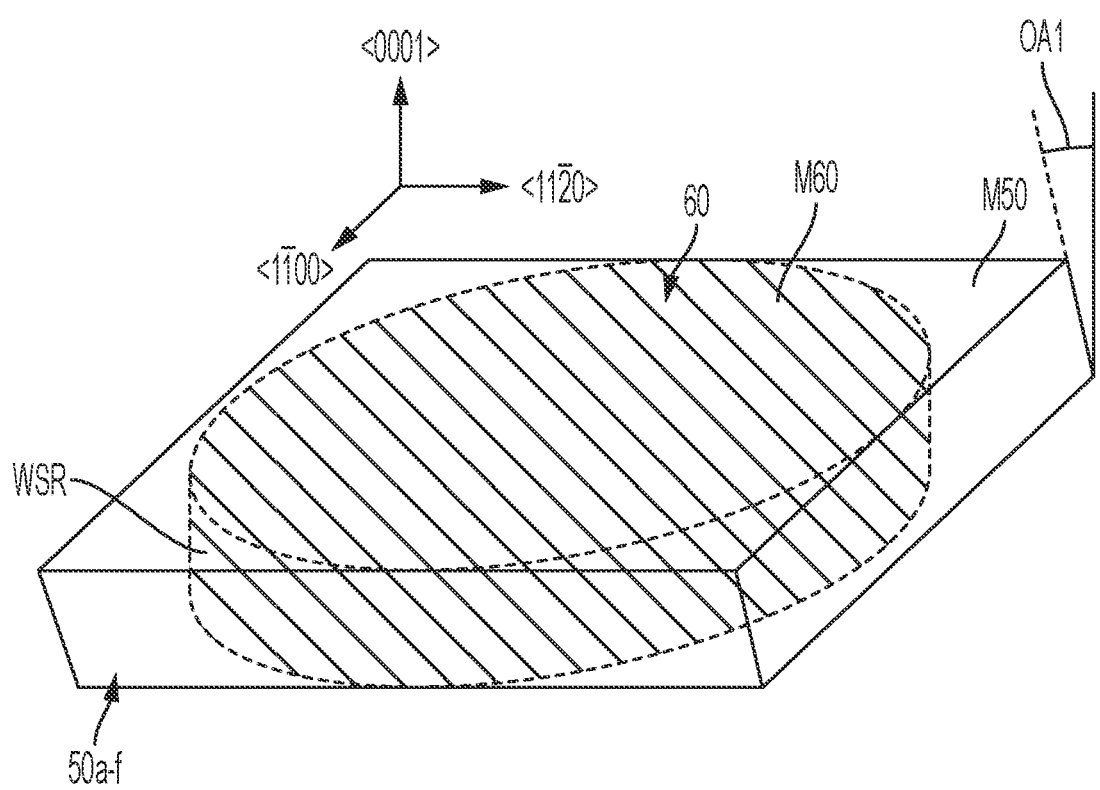
FIG. 6 shows a schematic perspective view of a core drilling step on a square on-axis single crystal silicon carbide wafer.

FIG. 6 shows a core drilling step of a parallelpiped single crystal hexagonal-silicon carbide substrate 50(a-f) to produce round single crystal hexagonal-silicon carbide substrate 60 with main surface M60 surrounded by round surface WSR. The diameter of silicon carbide wafer 60 is 20 to 70 mm. Main surface M60 is identically oriented to main surface M50 with an on-axis surface consisting of either a {0001}, {11$\bar{2}$0}, or {1$\bar{1}$00} plane.

Figure 7:
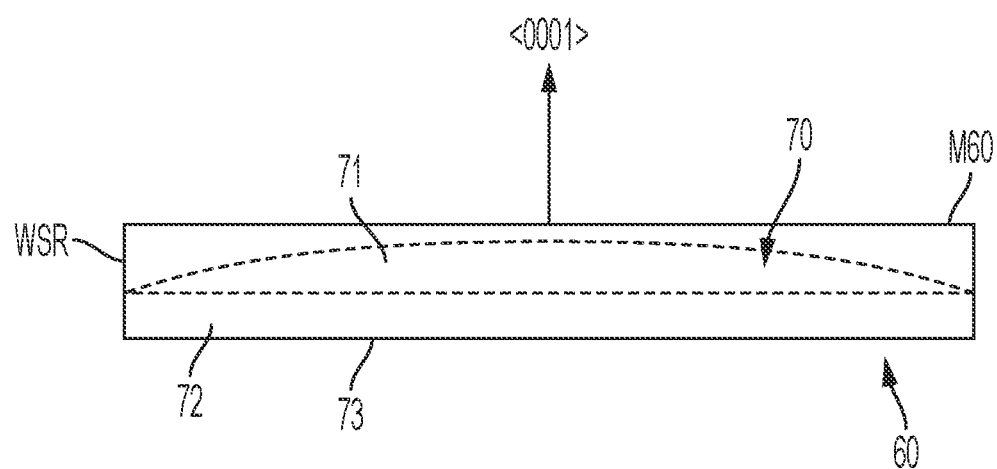
FIG. 7 shows schematic side view of the grinding/lapping/polishing steps of a circular single crystal silicon carbide wafer to form a domed-wafer.
Figure 8:
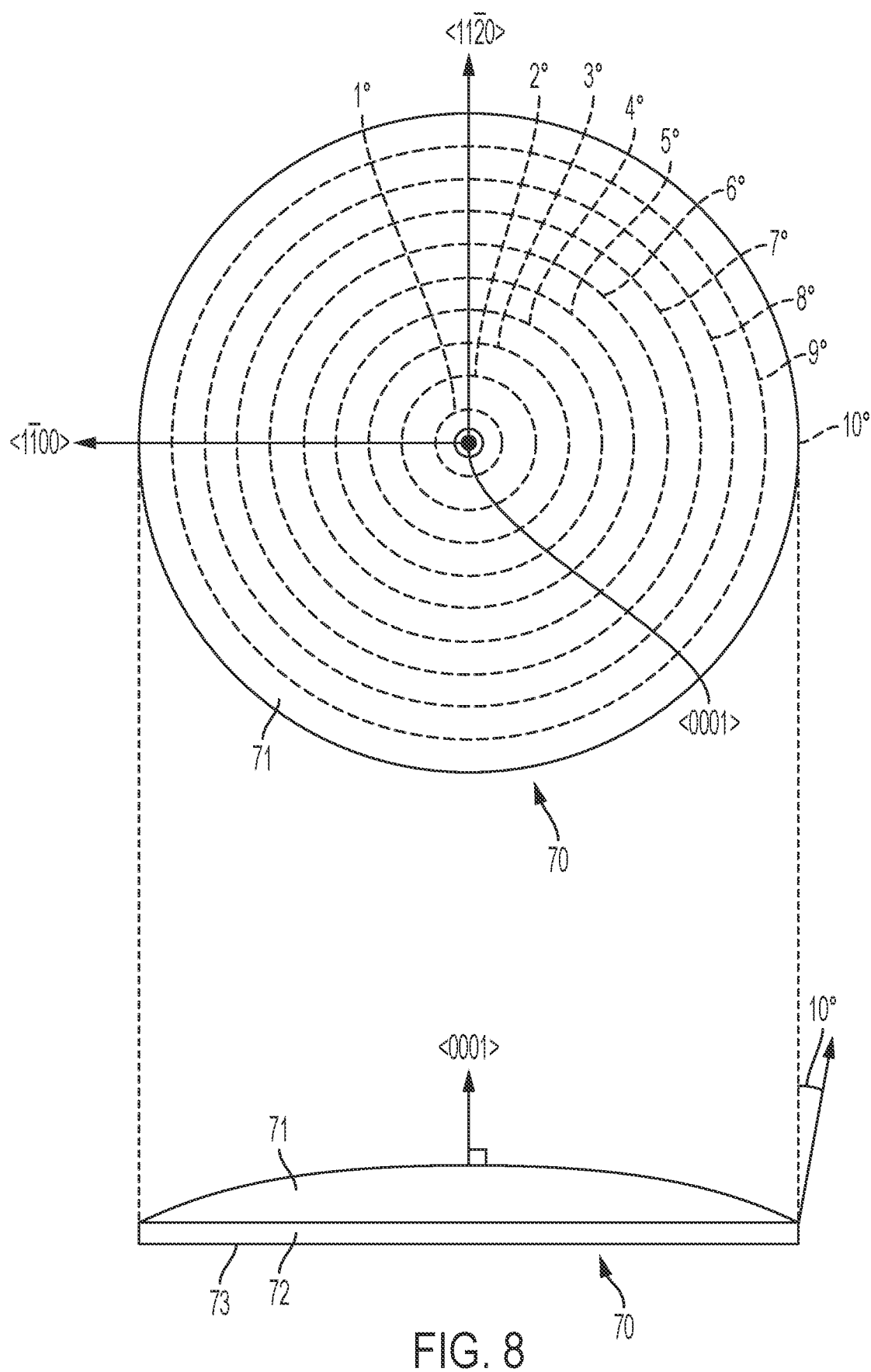
FIG. 8 shows a schematic of the side view and top view of the contours from a hexagonal-silicon carbide domed wafer.

FIGS. 7 and 8 show wafer grinding, lapping, and polishing steps of round single crystal hexagonal-silicon carbide substrate 60 to form single crystal hexagonal-silicon carbide domed substrate 70. A grind radius is chosen that produces a domed surface defined by a continuous range of off-angle OA1 from 0 to 10 degrees with respect to a $\langle$0001$\rangle$, $\langle$11$\bar{2}$0$\rangle$, or $\langle$1$\bar{1}$00$\rangle$ polar axis, and 0 to 360 degrees of an azimuthal off-angle OA2. Silicon carbide is an exceptionally hard material, registering a hardness value of 9 out 10 on the Mohs hardness scale. Therefore, a sequence of lapping and polishing steps utilizing decreasing abrasive sizes follows the dome-shaping process to remove preceding grinding, lapping, and polishing defects. An example of the sequence is as follows. Subsequent to dome-shaping of single crystal hexagonal-silicon carbide substrate 60, a series of cast iron lapping steps is performed with abrasive size decreasing from 15 μm, to 6 μm, and finally 3 μm with each lapping sequence lasting for 30 minutes. Next, a polishing sequence is performed with abrasive size decreasing from 1 μm to 0.25 μm for a period of 8 hours and 2 hours respectively. A pitch lapping step follows the polishing sequence using a 0.1 μm abrasive size for 2 hours. The grinding, lapping, and polishing sequence is then finished with a chemical mechanical polishing (CMP) step to bring the domed surface to atomic level smoothness. The resulting single crystal hexagonal-silicon carbide domed substrate 70 is comprised of domed surface 71 and back surface 73 surrounded by round side surface 72.

Figure 9:
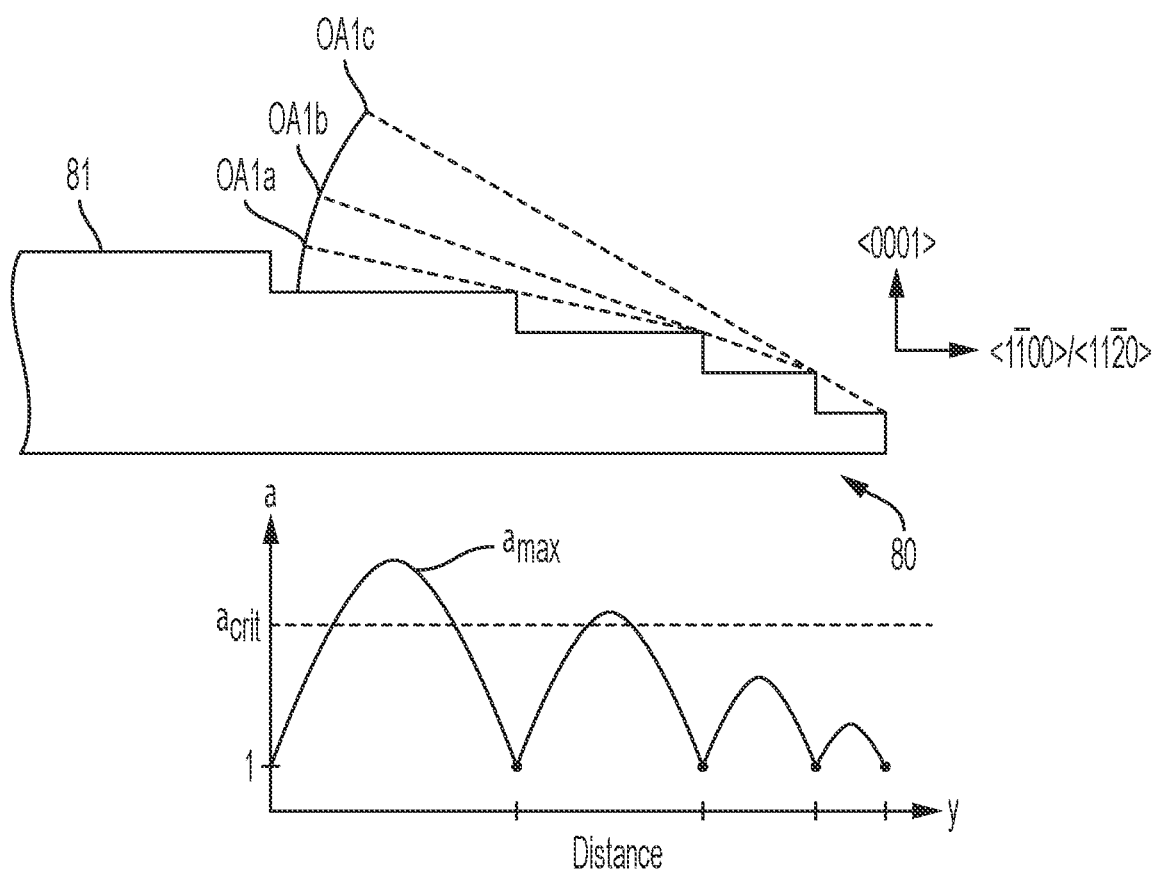
FIG. 9 shows a schematic side view of a hydrogen etched domed wafer and a corresponding diagram of the position dependent supersaturation ratio.
Figure 10:
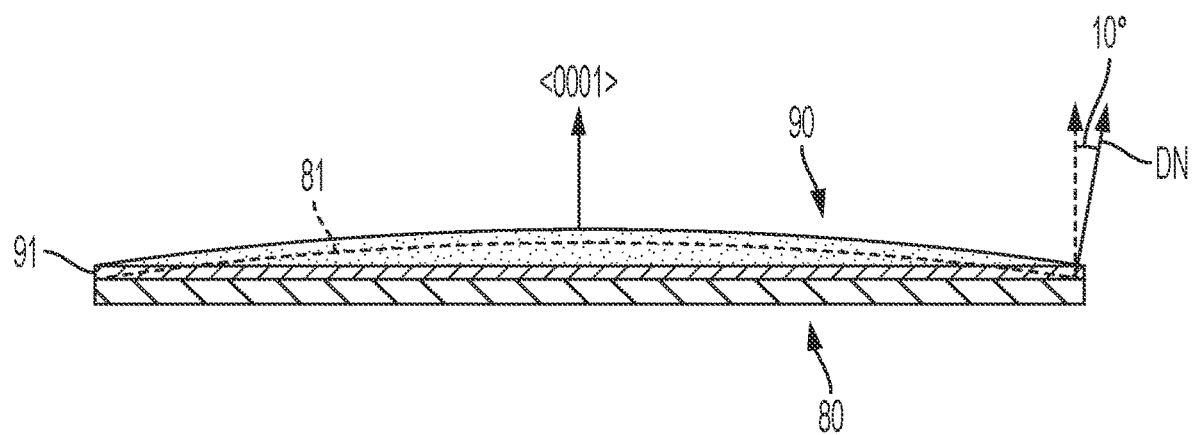
FIG. 10 shows a schematic side view of a film deposition growth step on a etched hexagonal-silicon carbide domed wafer.

Including the previously described method for fabricating silicon carbide domed substrate 70, a method for identifying hexagonal-SiC off-axis surfaces that support surface chemistries and kinetics to selectively produce various epitaxial growth modes of the metastable 3C-SiC polytype is described in FIGS. 9-13. Following the CMP process to produce atomically smooth domed surface 71, a conventional wafer degreasing and cleaning process step is conducted to remove residual particulate and carbon contamination prior to loading in a growth chamber. The growth chamber is that of a vapor phase mediated growth technique that may include either sublimation type growth, chemical vapor deposition type growth, or a combination thereof. Next, an in situ vapor phase hydrogen etching step is conducted to remove residual native oxide, polishing-induced surface damage, and to produce a step-terrace structured growth surface. FIG. 9 shows a schematic side view of hydrogen etched single crystal hexagonal-silicon carbide domed substrate 80 with step-terrace structured growth surface 81, and a corresponding qualitative diagram of the radial position dependent supersaturation ratio α. Silicon carbide domed substrate 80 is shown projected along an $\langle$11$\bar{2}$0$\rangle$ or $\langle$1$\bar{1}$00$\rangle$ direction with {0001} oriented terraces where straight steps are produced. It is shown for a domed substrate that as the distance increases radially from the polar axis (in the case of FIG. 9 a $\langle$0001$\rangle$ polar axis), the magnitude of off-angle OA1 increases and the terrace width decreases. Consequently, the supersaturation ratio α versus radial distance y diagram shows that growth surface 81 has the effect of modulating the supersaturation ratio α for any given set of growth conditions defined by the user. For any given set of growth conditions there will exists some critical value of the supersaturation ratio $\alpha_{crit}$, whose effects will be empirically evident by the resulting nucleation and growth behavior across growth surface 81. Furthermore, by incorporating growth upon a structure with varying off-angle OA1 across all rotational orientations, the effects of non-low index oriented step-terrace structures on the critical supersaturation ratio $\alpha_{crit}$ can directly be observed and compared to conventional low-index oriented off-axis surfaces. Accordingly, FIG. 10 shows a film deposition step to form epitaxial domed wafer 90 comprised of single crystal hexagonal-silicon carbide domed substrate 80 and epitaxial layer 91. The deposition step can be conducted using sublimation type growth, chemical vapor deposition type growth, or a combination thereof.

Figure 11:
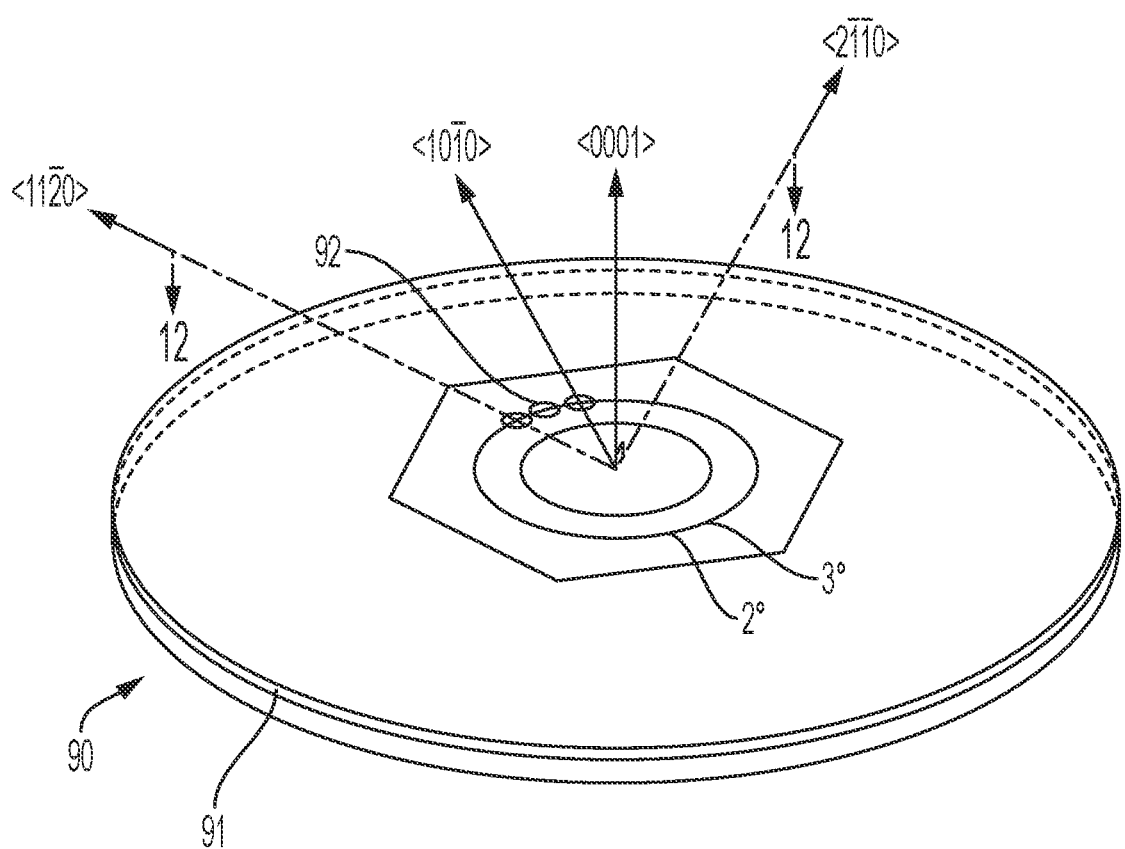
FIG. 11 shows a schematic perspective view of a non-destructive characterization step on a hexagonal-silicon carbide domed wafer with an epitaxial layer.

Due to both the anisotropy and symmetry of the crystal structure for hexagonal silicon carbide substrates, step-terrace structured growth surface 81 of hexagonal silicon carbide domed substrate 80 will have a unique range of step-terrace structure geometries between and including a $\langle$11$\bar{2}$0$\rangle$ direction and adjacent $\langle$10$\bar{1}$0$\rangle$ direction that includes a span of 30 azimuthal degrees. The entirety of step-terraced growth surface 81 is thus a repetition of this region through symmetry operations. Likewise, for any given set of growth conditions enacted upon step-terrace structured growth surface 81, an epitaxial layer 91 may have a unique set of structural characteristics between and including a $\langle$11$\bar{2}$0$\rangle$ direction and adjacent $\langle$10$\bar{1}$0$\rangle$ direction. FIG. 11 shows a plan-view characterization step of epitaxial domed wafer 90. Region of interest 92 corresponds to a particular region of epitaxial layer 91 grown upon an off-axis surface of off-angle OA1 oriented in a particular direction of which a materials characterization instrument can be focused to extract physical, optical, or chemical information. Characterization techniques with the spatial resolution to extract information unique to a particular off-axis surface may include but is not limited to atomic force microscopy, Raman spectroscopy, scanning electron microscopy, ellipsometry, differential interference contrast microscopy, and micro X-ray diffraction.

Figure 12:
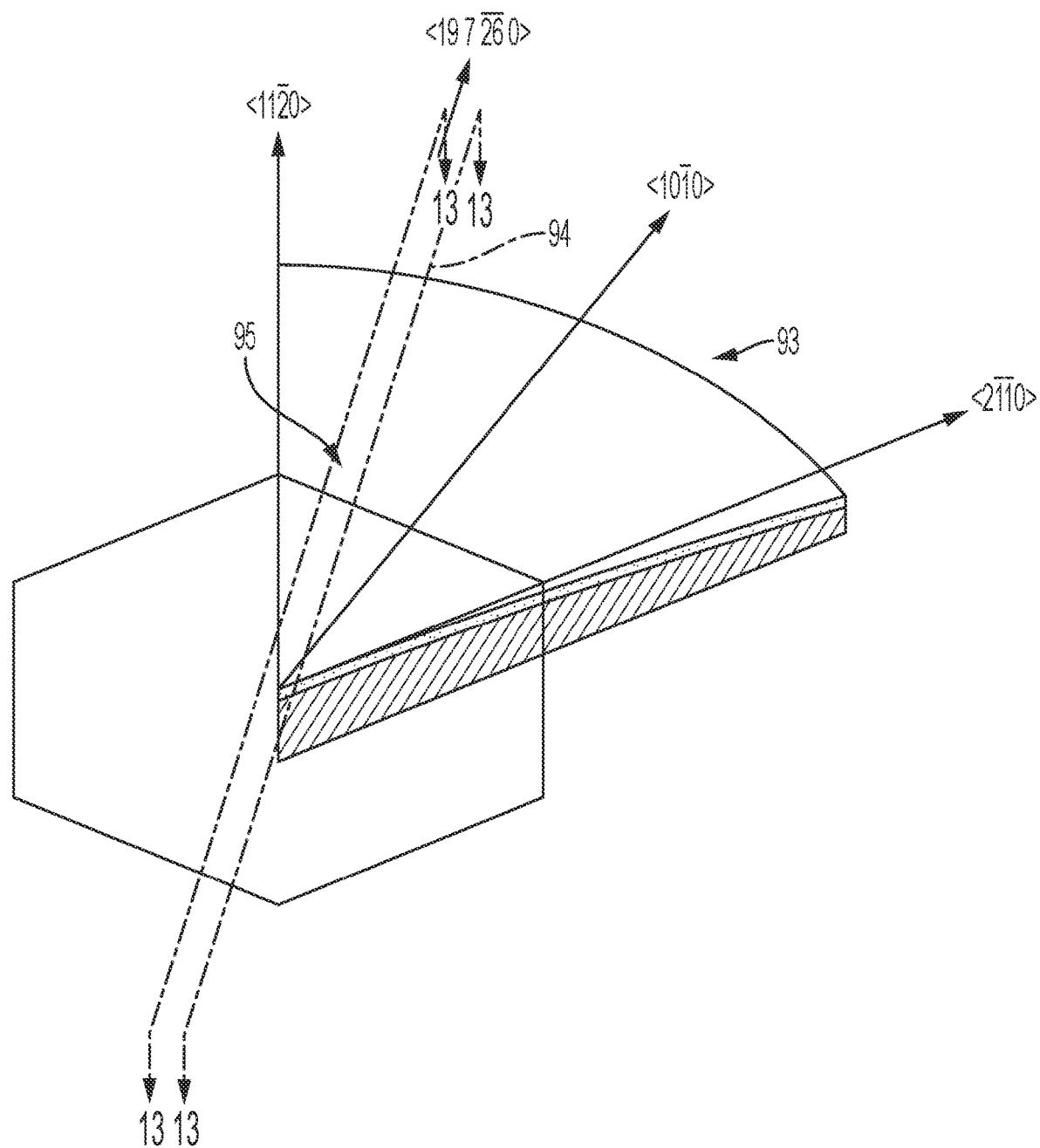
FIG. 12 shows schematic perspective view of an orientation specific dicing sequence step to prepare samples for cross-sectional characterization.
Figure 13:
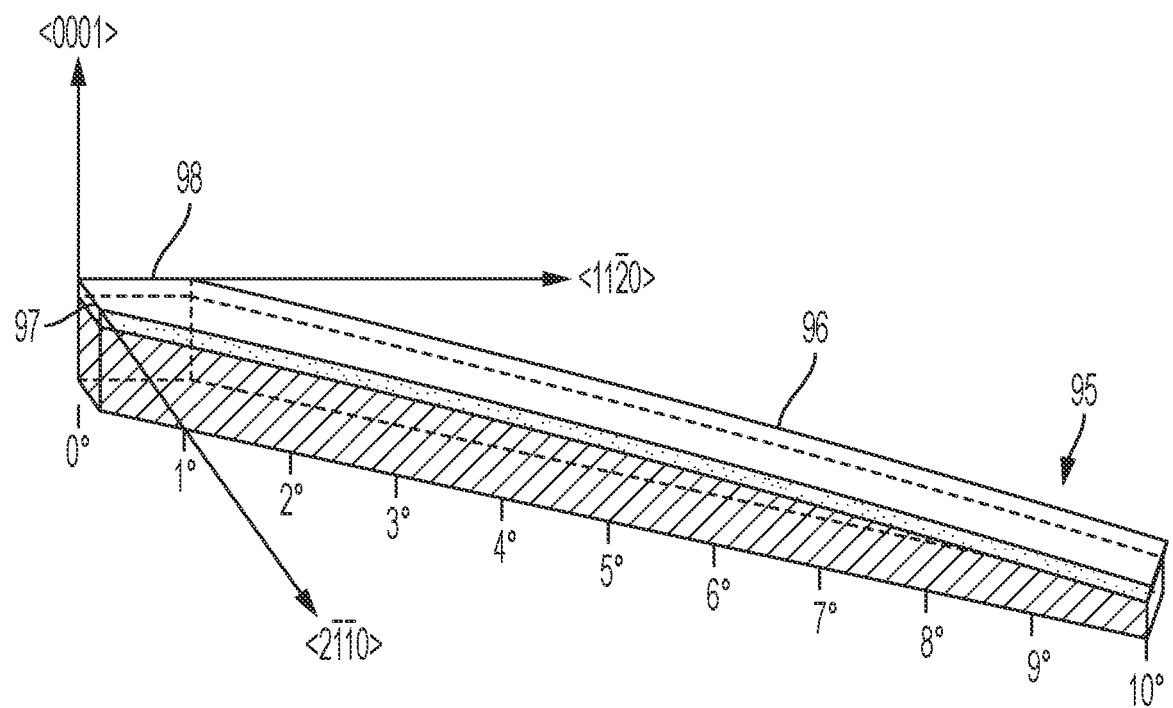
FIG. 13 shows a schematic perspective view of an orientation specific wafer cross section.

Next, a method for conducting cross-sectional characterization is described in FIGS. 11-13. FIG. 11 also shows a dicing step of epitaxial domed wafer 90 along the $\langle$11$\bar{2}$0$\rangle$ and $\langle$2$\bar{1}\bar{1}$0$\rangle$ directions, and FIG. 12 shows epitaxial domed wafer section 93 cut from epitaxial domed wafer 90 along the $\langle$11$\bar{2}$0$\rangle$ and $\langle$2$\bar{1}\bar{1}$0$\rangle$ directions. In other embodiments, epitaxial domed wafer section 93 may be defined by cutting along any other combination of low index directions. Next, an orientation specific cross-section dicing step is performed on epitaxial domed wafer section 93 with a pair of cuts 94 that are parallel to the $\langle$19 7 $\overline{26}$ 0$\rangle$ direction as an example orientation of interest. The dicing sequence forms epitaxial domed wafer cross section 95. The rotational orientation of the $\langle$19 7 $\overline{26}$ 0$\rangle$ direction is approximately midway between adjacent low index $\langle$11$\bar{2}$0$\rangle$ and $\langle$10$\bar{1}$0$\rangle$ directions, measuring 14.9 degrees from the $\langle$11$\bar{2}$0$\rangle$ direction and 15.1 degrees from the $\langle$10$\bar{1}$0$\rangle$ direction. Two narrow spaced cuts are made oriented along the direction of interest that incorporate the polar axis of epitaxial domed wafer section 93. FIG. 13 shows epitaxial domed wafer cross section 95 with primary edge 96 oriented along the direction of interest and low index oriented edges 97 and 98 that are retained from the cut faces of epitaxial domed wafer section 93. With such a specimen, the role of off-angle OA1 (and by extension the role of the off-angle dependent supersaturation ratio) on nucleation behavior and observed growth mode can be evaluated by previously mentioned materials characterization techniques. In particular, the use of Raman spectroscopy depth profiling is enabled, allowing for the determination of silicon carbide polytype evolution as a function of both epitaxial film thickness and off-angle OA1 for a particular directional orientation from a single specimen.

The present invention can be applied towards a wide range of applicable fields that benefit from the development and fabrication of silicon carbide enabling technologies, specifically technologies based on the 3C-silicon carbide polytype. These technologies include large area graphene monolayer production, pressure sensors, biosensors, optics, nanophotonics, high electron mobility transistors, and CMOS high power electronics. In particular, across the group of aforementioned applications there is a requirement for a variety of high quality 3C-silicon carbide microstructures including <111> textured, <110> textured, and single crystal 3C-silicon carbide. Utilizing the present invention according to the disclosed embodiments can be used to select a hexagonal silicon carbide off-axis surface that best supports the growth of a particular 3C-silicon carbide microstructure best suited for a specific application. Especially unconventional off-axis surfaces that would provide an advantage over commercially available silicon carbide substrates. In some instances, shorter deposition times can be used to evaluate the nucleation behavior and initial polytype selectivity and growth modes. In other instances, longer deposition times can be used to evaluate resulting preferred orientation of polycrystalline regions of the epitaxial layer, defect character, and transitions between growth modes. All crucial components necessary to formulate crystal growth and production strategies needed to meet application performance requirements.

The previously described versions of the present invention have many advantages, including a high-throughput method for screening multiple off-axis surfaces, providing the ability to perform direct comparisons of growth behavior upon multiple off-axis surfaces under identical growth conditions, and providing an efficient use of resources towards exploratory and process development objectives.

While we have shown and described several embodiments in accordance with our invention, it should be understood that the same is susceptible to further changes and modifications without departing from the scope of our invention. Therefore, we do not want to be limited to the details shown and described herein but intend to cover all such changes and modifications as are encompassed by the scope of the appended claims.

What is claimed is:

1. A method for providing a mechanically prepared domed-substrate composed of single crystal hexagonal silicon carbide that serves as the medium for determining the role off-cut degree and orientation plays on altering surface chemistry for polytypic and microstructural selectivity through screening of silicon carbide surfaces that support surface chemistries and kinetics of selective polytypic and microstructural growth modes during silicon carbide deposition, comprising:
   a. fabricating a silicon carbide domed substrate;
   b. forming a step-terrace growth surface on the domed surface of said silicon carbide domed substrate by hydrogen etching;
   c. performing silicon carbide deposition upon said growth surface, thereby creating a silicon carbide epitaxial domed wafer; and
   d. performing characterization of said silicon carbide epitaxial domed wafer.

2. The method of claim 1, wherein the silicon carbide domed substrate is a silicon carbide single crystal with a polytype selected from the group consisting of the 3C, 4H, 6H, 2H, and 15R polytypes.

3. The method of claim 1, wherein the silicon carbide domed substrate contains an atomically smooth domed surface with either a $\langle 0001 \rangle$, $\langle 11\bar{2}0 \rangle$, or $\langle 1\bar{1}00 \rangle$ polar axis.

4. The method of claim 1, wherein the silicon carbide domed substrate has a diameter within the range of 20 mm to 200 mm.

5. The method of claim 1, wherein the silicon carbide domed substrate contains an atomically smooth domed surface defined by a continuous variation of an off-cut angle from a polar axis ranging from 0 degrees to some maximum off-cut angle, and 360 azimuth degrees.

6. The silicon carbide domed substrate according to claim 5, wherein the maximum off-cut angle is within the range of 4 degrees to 20 degrees.

7. The method of claim 1, wherein the fabrication of a silicon carbide domed substrate further comprises:
   a. core drilling an on-axis bulk single crystal silicon carbide boule producing a single crystal silicon carbide cylinder such that the top and bottom surface of said silicon carbide cylinder is an on-axis surface;
   b. forming a flat silicon carbide substrate from dicing said silicon carbide cylinder with cuts oriented parallel to the on-axis surface such that the top and bottom surface of said silicon carbide substrate is an on-axis surface; and
   c. forming a domed silicon carbide substrate from said flat silicon carbide substrate by grinding, polishing, and chemical mechanical polishing such that the domed silicon carbide substrate has an on-axis surface and an atomically smooth domed surface with a $\langle 0001 \rangle$ polar axis.

8. The method of claim 1, wherein the fabrication of a silicon carbide domed substrate further comprises:
   a. forming a flat silicon carbide substrate from dicing an on-axis bulk single crystal silicon carbide boule with cuts oriented parallel to the on-axis surface such that the top and bottom surface of said silicon carbide substrate is an on-axis surface; and
   b. forming a domed silicon carbide substrate from said flat silicon carbide substrate by grinding, polishing, and chemical mechanical polishing such that the domed silicon carbide substrate has an on-axis surface and an atomically smooth domed surface with a $\langle 0001 \rangle$ polar axis.

9. The method of claim 1, wherein the fabrication of a silicon carbide domed substrate further comprises:
   a. dicing an on-axis bulk single crystal silicon carbide boule producing a silicon carbide parallelpiped such that the surfaces are comprised of $\{0001\}$, $\{11\bar{2}0\}$, and $\{1\bar{1}00\}$ surfaces;
   b. core drilling said silicon carbide parallelpiped producing a single crystal silicon carbide cylinder such that the top and bottom flat surfaces are either an $\{0001\}$, $\{11\bar{2}0\}$, or $\{1\bar{1}00\}$ on-axis surface;
   c. forming a flat silicon carbide substrate from said silicon carbide cylinder by dicing with cuts oriented parallel to the on-axis surface such that the top and bottom surface of said silicon carbide substrate are either an $\{0001\}$, $\{11\bar{2}0\}$, or $\{1\bar{1}00\}$ on-axis surface; and
   d. forming a domed silicon carbide substrate from said flat silicon carbide substrate by grinding, polishing, and chemical mechanical polishing such that the domed silicon carbide substrate has an on-axis surface and an atomically smooth domed surface with a ⟨0001⟩, ⟨11$\bar{2}$0⟩, or ⟨1$\bar{1}$00⟩ polar axis.

10. The method of claim 1, wherein the fabrication of a silicon carbide domed substrate further comprises:
   a. dicing an {0001} off-axis bulk single crystal silicon carbide boule with cuts parallel to the {0001} plane forming an on-axis bulk single crystal silicon carbide boule; and
   b. forming a flat silicon carbide substrate from dicing said on-axis bulk single crystal silicon carbide boule with cuts oriented parallel to the on-axis surface such that the top and bottom surface of said silicon carbide substrate is an on-axis surface; and
   c. forming a domed silicon carbide substrate from said flat silicon carbide substrate by grinding, polishing, and chemical mechanical polishing such that the domed silicon carbide substrate has an on-axis surface and an atomically smooth domed surface with a ⟨0001⟩ polar axis.

11. The method of claim 1, wherein the fabrication of a silicon carbide domed substrate further comprises:
   a. dicing an {0001} off-axis bulk single crystal silicon carbide boule producing a {0001} off-axis silicon carbide parallelpiped such that one pair of identical surfaces are comprised of a {0001} off-axis surface, and at least one other pair of identical surfaces are comprised of either a {1$\bar{1}$00} or {11$\bar{2}$0} surface;
   b. forming an {0001} on-axis silicon carbide parallelpiped from cutting said off-axis silicon carbide parallelpiped such that one pair of identical surfaces are comprised of a {0001} on-axis surface, and at least one other pair of identical surfaces are comprised of either a {1$\bar{1}$00} or {11$\bar{2}$0} surface;
   c. forming a flat silicon carbide substrate from dicing said on-axis silicon carbide parallelpiped with cuts oriented parallel to either a {0001}, {11$\bar{2}$0}, or {1$\bar{1}$00} on-axis surface such that at least two pairs of identical surfaces contain a combination of {0001}, {11$\bar{2}$0}, or {1$\bar{1}$00} surfaces;
   d. forming a circular silicon carbide substrate from core drilling said flat silicon carbide substrate such that the top and bottom flat surface is either a {0001}, {11$\bar{2}$0}, or {1$\bar{1}$00} on-axis surface; and
   e. forming a domed silicon carbide substrate from said circular silicon carbide substrate by grinding, polishing, and chemical mechanical polishing such that the domed silicon carbide substrate has an {0001}, {11$\bar{2}$0}, or {1$\bar{1}$00} on-axis surface and an atomically smooth domed surface with a ⟨0001⟩, ⟨11$\bar{2}$0⟩, or ⟨1$\bar{1}$00⟩ polar axis.

12. The method for manufacturing the silicon carbide epitaxial domed wafer in claim 1, wherein one of chemical vapor deposition (CVD), physical vapor transport (PVT), continuous feed-PVT, physical vapor deposition (PVD), liquid phase epitaxy (LPE), or vapor-liquid-solid methods is used for forming the epitaxial film on the step-terrace growth surface of the domed silicon carbide substrate.

13. The method for characterizing the silicon carbide epitaxial domed wafer in claim 1, wherein characterization is performed in either a plan-view or cross sectional configuration with one or more methods including optical microscopy, differential interference contrast microscopy, atomic force microscopy, scanning electron microscopy, scanning/transmission electron microscopy, X-ray photoelectron spectroscopy, Raman spectroscopy, UV-Vis spectroscopy, ellipsometry, (micro) X-ray diffraction, Synchrotron X-ray analysis, electron diffraction, and neutron scattering.

* * * * *